United States Patent [19]

Korzik et al.

[11] 4,437,717
[45] Mar. 20, 1984

[54] RACK MOUNTABLE PRIMARY POWER AC PLUG

[75] Inventors: James L. Korzik, Palm Harbor; Thomas Wissman, Largo, both of Fla.

[73] Assignee: Paradyne Corporation, Largo, Fla.

[21] Appl. No.: 306,543

[22] Filed: Sep. 28, 1981

[51] Int. Cl.³ .............................................. H05K 1/18
[52] U.S. Cl. .......................... 339/17 LC; 339/17 LM; 339/17 M
[58] Field of Search ............... 361/415, 413, 393, 395; 211/41; 339/17 LC, 17 M, 17 LM, 196 A

[56] References Cited

U.S. PATENT DOCUMENTS 2,714,713  8/1955  Parajon .......................... 339/21 R X
3,450,950  6/1969  Tarrats ................................ 361/415

FOREIGN PATENT DOCUMENTS 179272  5/1962  Sweden ............................ 339/196 A Primary Examiner—Mark Rosenbaum
Attorney, Agent, or Firm—Kane, Dalsimer, Kane, Sullivan & Kurucz

[57] ABSTRACT

A device for supplying power to a printed circuit card when disposed in a rack mounted card cage, which has a plug maintained in the cage and coupled to leads connectable to a source of primary power (USA or European); a printed circuit card having a receptacle to provide a mating relationship with the plug and to provide power to the card; a backplane supported by the card, functionally separate from the receptacle for mating with an M-board maintained by the cage; with the plug providing primary power to the card via the receptacle, separate from the backplane and formed so as to allow for coupling even if slight misalignment of the plug and receptacle.

8 Claims, 4 Drawing Figures

RACK MOUNTABLE PRIMARY POWER AC PLUG

FIELD OF THE INVENTION

The present invention relates to a power receptacle for use in rack mounting printed circuit cards.

BACKGROUND OF THE INVENTION

It has presently become popular to mount printed circuits (PC) cards individually in stand alone cases. When it is desired to take an individual (PC) card from the stand alone case and place it in a rack mount arrangement, it presently requires that in order to bring power (AC) into the PC card, the AC be routed to the backplane of the card via gold fingers to connector contact or connector to connector contact. This requires modification of the wiring on that board, which is cumbersome.

Also, while a separate line cord may be used it, requires that it be individually and manually plugged into a power receptacle at the same time of installation of the PC card.

SUMMARY OF THE INVENTION

Accordingly, it is an object of the invention to provide for power coupling which facilitates the rack mounting of individual PC cards without requiring modification of the backplane of the card or separate manual connection of a power source to the PC card.

In this regard, a plurality of plugs are provided, with individual plug to be coupled to each PC card placed in a rack mounted card cage. The plugs are adapted to engage a respective power receptacle on the PC card which is separate from the backplane. These plugs are mounted on a bracket in a parallel arrangement above an M-board (mother board) mounted on the card cage which is adapted to engage the PC cards backplane via gold fingers. As the PC cards are inserted into the card cage the individual plugs engage the respective receptacles on the separate PC cards. The plugs are constructed so that a certain degree of offcenter mating is allowed so as to facilitate its coupling with the power receptacle on the PC card, and are capable for use with both USA and European power supplies (110-220 volts).

At the same time, the PC card backplane, via gold finger contacts, engages the M-board of the card cage, which is now free from the AC power coupling. Modification of the backplane is thereby avoided with the plug allowing AC coupling directly through the existing power circuit of the PC card with the goldfinger contacts allowing signals to be connected between the backplane and the M-board.

BRIEF DESCRIPTION OF THE DRAWINGS

The above mentioned and other features and objects of this invention will become more apparent by reference to the following description which is to be taken in conjunction with the drawings.

DETAIL DESCRIPTION OF THE PREFERRED EMBODIMENT

Figure 1:
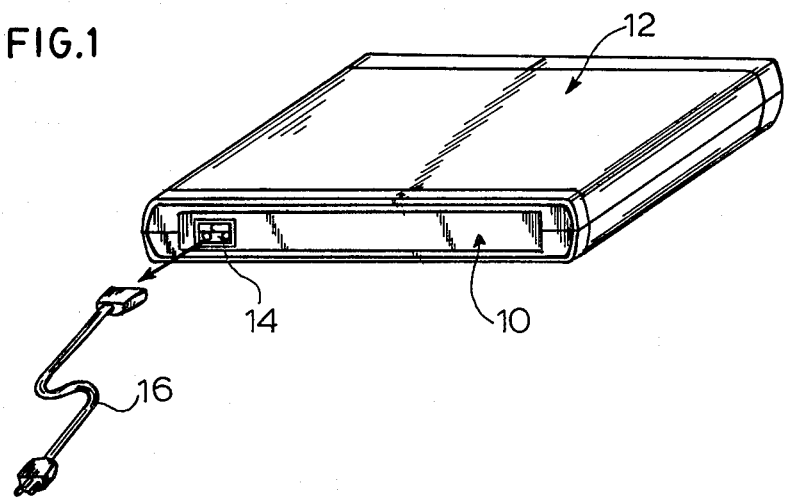
FIG. 1 is a perspective view of a PC card mounted in a stand alone case.
Figure 2:
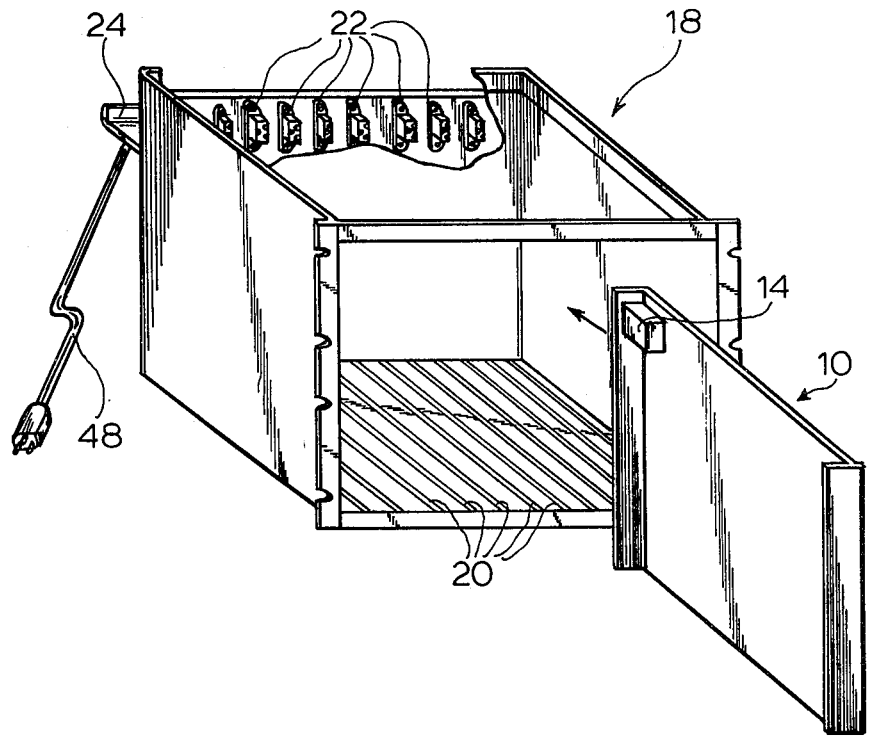
FIG. 2 is a partially sectional view of a rack mounted card cage incorporating the teachings of the present invention.
Figure 3:
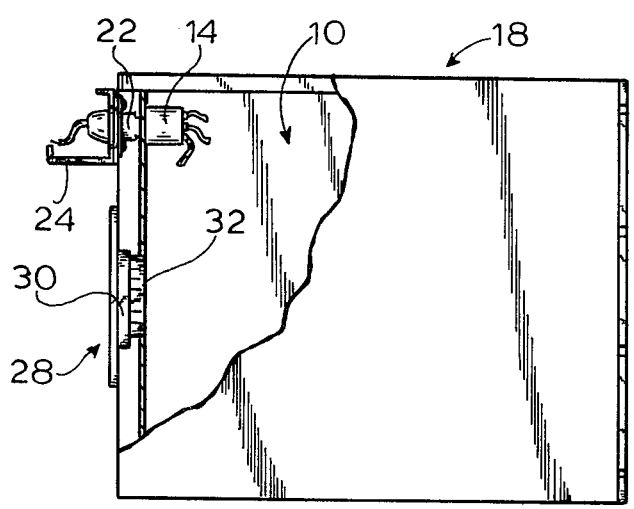
FIG. 3 is a partially sectional side view of a rack mounted card cage incorporating the teaching of the present invention.

Turning now to FIG. 1 there is depicted a PC cord 10 which is shown mounted in a stand alone in case 12. Power to the PC card 10 is supplied via a receptacle 14 mounted thereon adapted to engage a standard power cord 16. As can be seen in FIGS. 2 and 3, when it is desired to place the PC card 10 into a rack mounted card cage 18, it is simply disconnected from the standard power cord 16, removed from the stand alone case 12, and inserted endwise into the card cage 18, as shown in FIG. 2. To assist in this, the cage 18 may be provided with runners 20 to guide the PC card 10 into engagement with the rack mountable primary power AC plug 22, shown most clearly in FIG. 3.

Figure 4:
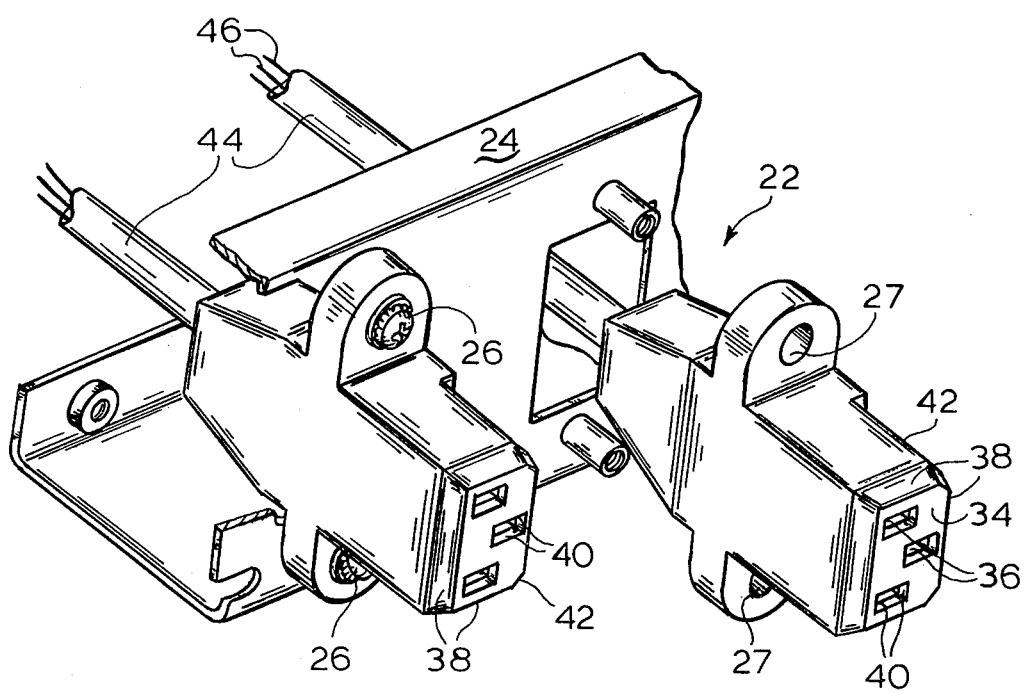
FIG. 4 is a perspective view of a plurality of power plugs prior to and mounted on a rack mounted plug bracket incorporating the teachings of the present invention.

With reference to FIGS. 2-4, individual plug 22 may be mounted on a bracket 24 which in turn is mounted to the far end cage 18. Each plug 22 may be mounted by way of screws 26, affixed through openings 27 to the bracket 24, which may be made out of sheet metal. As can be seen, the plugs 22 are mounted parallel to each other with a portion extending into the interior of the cage 18 to engage the receptacle 14 on the PC card. (FIG. 3). Note that the M-board 28 of the cage 18 is positioned below the plug bracket 24, having a portion 30 extending into the interior of the cage 18 and upon insertion of the PC card 10 into the cage 18 serves to engage the backplane 32 of the PC card 10 and goldfinger contacts thereon.

The fully inserted receptacle 14 mates with the plug 22 placing the M-board 28 free from the AC power supply.

Turning now particularly to FIG. 4, the plug 22 is intended to be a USA/European (110-220 volts) primary power plug to be used in conjunction with standard USA/European primary power line cord receptacles. The material for the plug 22 may be PVC having a duramater hardness of 90+3 (shore "A" scale).

A standard face 34 (approximately 0.930×0.620 inches) is provided with contact openings 36. About the edges of the face 34 and contact openings 36 are bevel edges 38 and 40 respectively. These bevels are preferably at approximately 30° and are approximately 0.125 and 0.06 inches in length respectively. Note that two additional bevels 42 are provided in each plug and extend approximately ¾" back from face 34. When the PC card 10 engages the plug 22, the bevels on the plug 22 align it with receptacle 14 with proper contact being made therebetween. The bevels permit the off center mating with the receptacle 14 up to approximately 3/32".

Connected to the plug 22 is a lead 44 which may be of the type SVT vinyl 125 V-60° C. having conductor wires 46 (18/3) therein which may be CEE color coded. Each of the plug leads 46 may be connected to the respective leads on the other plug in the cage 18 to form line cord 48 as shown in FIG. 2.

Thus by the above noted invention direct AC plug receptacle mating is provided when a PC card 10 is inserted in a card cage 18, with no alteration in wiring needed to bring the AC into the backplane and no need to plug an external line cord into the receptacle as heretofore necessary. Although a preferred embodiment has been disclosed in detail herein, the scope of the invention should not be limited thereby, rather its scope should be determined by that of the appended claims.

What is claimed is:

1. A device for use in combination with a rack mounted card cage to supply power to a printed circuit card when disposed in the rack mounted card cage, which includes:

a plug means coupled to lead means connectable to a source of primary power;

a printed circuit card having receiving means to provide a mating relationship with said plug means and to provide power to said card;

a back plane supported by said card and functionally separate from said receiving means;

an M-board supported by the card cage for coupling with said back plane when said card is disposed in said cage; and wherein said receiving means and said plug means function to provide primary power to said card separate from said M-board and back plane.

2. The invention in accordance with claim 1 which includes a plurality of plug means supported by the card cage in a substantially straight line substantially parallel to the M-board.

3. The invention in accordance with claim 2 wherein said plug means connect with the receiving means to supply 110 v primary power to the printed circuit card.

4. The invention in accordance with claim 2 wherein said plug means is connectable with the receiving means to supply 220 v primary power to the printed circuit card.

5. A device for supplying power for a printed circuit card in a rack mounted card cage, with the device including:

a rack mounted card cage;

plurality of plug means, a separate plug means for each printed circuit card which is operatively maintained in said cage;

plug means having a generally rectangular face portion beveled rearwardly from said face portion;

said plug means including lead means connectable with leads maintained by a receiving means on said printed card circuit to provide primary power to said card;

said face portion having openings therein for said lead means, with said openings beveled rearwardly from said openings;

an M-board supported by the card cage;

a back plane supported by the printed circuit card for coupling with said M-board when said card is disposed in said cage; and wherein said receiving means and said plug means function to provide primary power to said card separate from said M-board and back plane.

6. The invention in accordance with claim 5 wherein the plurality of plug means are supported by the card cage in a substantially straight line substantially parallel to the M-board.

7. The invention in accordance with claim 6 wherein said plug means is connectable with the receiving means to supply 110 v primary power to the printed circuit card.

8. The invention in accordance with claim 6 wherein said plug means is connectable with the receiving means to supply 220 v primary power to the printed circuit card.

* * * * *